United States Patent
Kim

(10) Patent No.: US 11,862,262 B2
(45) Date of Patent: Jan. 2, 2024

(54) MEMORY SYSTEM

(71) Applicant: SAMSUNG ELECTRONICS CO., LTD., Suwon-si (KR)

(72) Inventor: Youngbong Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 179 days.

(21) Appl. No.: 17/473,112

(22) Filed: Sep. 13, 2021

(65) Prior Publication Data
US 2022/0238169 A1 Jul. 28, 2022

(30) Foreign Application Priority Data

Jan. 25, 2021 (KR) ........................ 10-2021-0010170

(51) Int. Cl.
| | | |
|---|---|---|
| G11C 16/10 | (2006.01) | |
| G11C 16/34 | (2006.01) | |
| G11C 16/32 | (2006.01) | |
| G11C 16/30 | (2006.01) | |
| G11C 16/08 | (2006.01) | |
| G11C 16/26 | (2006.01) | |

(52) U.S. Cl.
CPC .......... *G11C 16/3495* (2013.01); *G11C 16/08* (2013.01); *G11C 16/10* (2013.01); *G11C 16/102* (2013.01); *G11C 16/26* (2013.01); *G11C 16/30* (2013.01); *G11C 16/32* (2013.01); *G11C 16/3454* (2013.01)

(58) Field of Classification Search
CPC ..... G11C 16/3495; G11C 16/08; G11C 16/10; G11C 16/102; G11C 16/26; G11C 16/30; G11C 16/32; G11C 16/3454; G11C 29/023; G11C 29/028; G11C 16/0483; G11C 2029/1202; G11C 7/04; G11C 16/3418; G06F 3/0658; G06F 3/0679
See application file for complete search history.

(56) References Cited

U.S. PATENT DOCUMENTS

| | | |
|---|---|---|
| 7,679,133 B2 | 3/2010 | Son et al. |
| 8,553,466 B2 | 10/2013 | Han et al. |
| 8,559,235 B2 | 10/2013 | Yoon et al. |
| 8,654,587 B2 | 2/2014 | Yoon et al. |
| 9,658,277 B2 | 5/2017 | Walker |
| 10,559,370 B2 | 2/2020 | Yang et al. |
| 10,685,726 B2 | 6/2020 | Suzuki et al. |
| 10,741,262 B2 | 8/2020 | Lin et al. |

(Continued)

*Primary Examiner* — Jay W. Radke
(74) *Attorney, Agent, or Firm* — Muir Patent Law, PLLC

(57) ABSTRACT

A memory system includes: nonvolatile memory devices and a memory controller confirming a programming time for each word line of each of the nonvolatile memory devices and calculating a target programming time on the basis of the programming time for each word line. Each of the nonvolatile memory devices receives the target programming time from the memory controller, and adjusts the programming time for each word line on the basis of the target programming time. When the adjustment of the programming time for each word line is completed, the memory controller confirms a variation width of a writing speed of the memory system for a predetermined time, and sets the target programming time as a final target programming time when the variation width of the writing speed is smaller than a reference value.

20 Claims, 14 Drawing Sheets

(56) References Cited

U.S. PATENT DOCUMENTS

| | | |
|---|---|---|
| 10,770,165 B1 | 9/2020 | Cai et al. |
| 2008/0247229 A1 | 10/2008 | Nguyen et al. |
| 2011/0233648 A1 | 9/2011 | Seol et al. |
| 2013/0201769 A1* | 8/2013 | Yang ................. G11C 16/32 |
| | | 365/189.011 |
| 2020/0051643 A1 | 2/2020 | Kim et al. |
| 2021/0166764 A1* | 6/2021 | Hong ................. G11C 11/5628 |
| 2023/0108751 A1* | 4/2023 | Lee .................... G06F 3/0604 |
| | | 711/154 |

* cited by examiner

| BLK | $t_{TARGET}$ |
|---|---|
| BLK1~BLK100 | $t_{TARGET}1$ |
| BLK101~BLK200 | $t_{TARGET}2$ |
| ⋮ | ⋮ |
| BLKk~BLKm | $t_{TARGET}m$ |

| WL | $t_{TARGET}$ |
|---|---|
| 1 | $t_{TARGET}1$ |
| 2 | $t_{TARGET}2$ |
| ⋮ | ⋮ |
| n | $t_{TARGET}n$ |

FIG. 16

MEMORY SYSTEM

CROSS-REFERENCE TO RELATED APPLICATION

Korean Patent Application No. 10-2021-0010170, filed on Jan. 25, 2021, in the Korean Intellectual Property Office, and entitled: "Memory System," is incorporated by reference herein in its entirety.

BACKGROUND

1. Field

Embodiments relate to a memory system.

2. Description of the Related Art

In accordance with an increase in a demand for a memory device having a small size and a high capacity, research into a memory device having vertically stacked memory cells has been actively conducted.

SUMMARY

Embodiments are directed to a memory system, including: nonvolatile memory devices respectively including a plurality of memory blocks, each of which includes a plurality of memory cells connected to a plurality of word lines; and a memory controller confirming a programming time for each word line of each of the nonvolatile memory devices and calculating a target programming time on the basis of the programming time for each word line. Each of the nonvolatile memory devices may receive the target programming time from the memory controller, and make an adjustment of the programming time for each word line on the basis of the target programming time, and, when the adjustment of the programming time for each word line is completed, the memory controller may confirm a variation width of a writing speed of the memory system for a predetermined time, and set the target programming time as a final target programming time when the variation width of the writing speed is smaller than a reference value.

Embodiments are directed to a memory system, including: a nonvolatile memory device including a plurality of word lines; and a memory controller setting a target programming time so that a variation width of a writing speed of the memory system for a predetermined time satisfies a reference value. The memory controller may transmit a target programming time corresponding to a word line to be programmed to the nonvolatile memory device, and, when the memory controller transmits a program command for the word line to the nonvolatile memory device, the nonvolatile memory device may confirm a programming time of the word line, and adjust the programming time of the word line on the basis of the target programming time.

Embodiments are directed to a memory system, including: a nonvolatile memory device including a plurality of memory blocks; and a memory controller setting a target programming time so that a variation width of a writing speed of the memory system for a predetermined time satisfies a reference value. At a power-on time of the memory system, when the memory controller transmits the target programming time to the nonvolatile memory device, the nonvolatile memory device may store the target programming time, and, when the memory controller transmits a program command for a word line to the nonvolatile memory device, the nonvolatile memory device may confirm a programming time of the word line, and adjusts the programming time of the word line on the basis of the target programming time.

BRIEF DESCRIPTION OF DRAWINGS

Features will become apparent to those of skill in the art by describing in detail example embodiments with reference to the attached drawings in which:

FIG. 16 is a view illustrating a target programming time according to an example embodiment.

DETAILED DESCRIPTION

Figure 1:
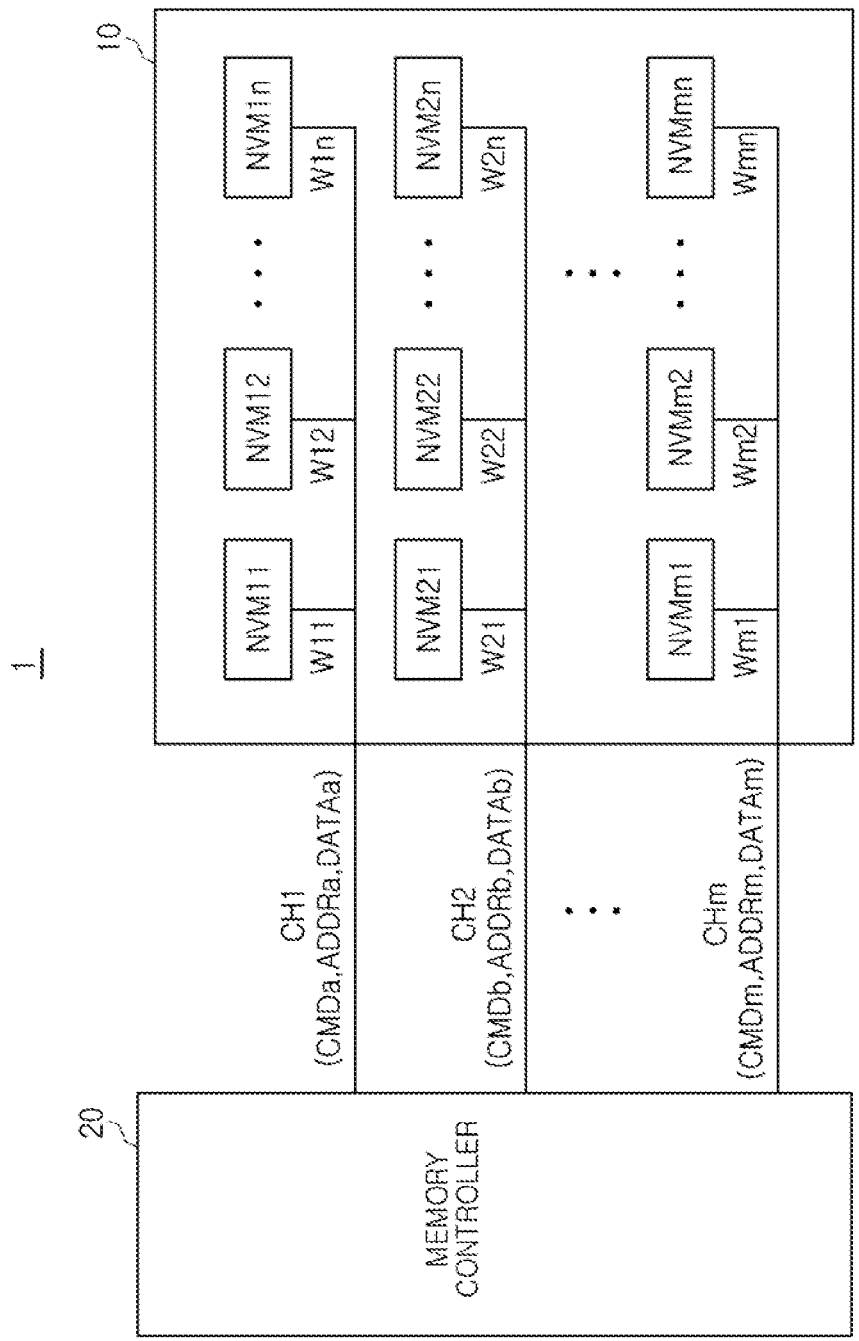
FIG. 1 is a schematic block diagram illustrating a memory system including a memory device according to an example embodiment.

FIG. 1 is a schematic block diagram illustrating a memory system including a memory device according to an example embodiment.

Referring to FIG. 1, a memory system 1 may include a memory 10 and a memory controller 20. The memory system 1 may support a plurality of channels CH1 to CHm, and the memory 10 and the memory controller 20 may be connected to each other through the plurality of channels CH1 to CHm. The memory system 1 may be implemented as, e.g., a storage device such as a solid state drive (SSD).

The memory 10 may include a plurality of nonvolatile memory devices NVM11 to NVMmn. Each of the nonvolatile memory devices NVM11 to NVMmn may be connected to one of the plurality of channels CH1 to CHm through a corresponding way. For example, the nonvolatile memory devices NVM11 to NVM1n may be connected to a first channel CH1 through ways W11 to W1n, and the nonvolatile memory devices NVM21 to NVM2n may be connected to a second channel CH2 through ways W21 to W2n. In an example embodiment, each of the nonvolatile memory devices NVM11 to NVMmn may be implemented in an arbitrary memory unit capable of operating according to an individual command from the memory controller 20. For example, each of the nonvolatile memory devices NVM11 to NVMmn may be implemented as a chip or die.

The memory controller 20 may transmit and receive signals to and from the memory 10 through the plurality of channels CH1 to CHm. For example, the memory controller 20 may transmit commands CMDa to CMDm, addresses ADDRa to ADDRm, and data DATAa to DATAm to the memory 10 or receive data DATAa to DATAm from the memory 10, through the channels CH1 to CHm.

The memory controller 20 may select one of the nonvolatile memory devices connected to a corresponding channel through each channel, and transmit and receive signals to and from the selected nonvolatile memory device. For example, the memory controller 20 may select the nonvolatile memory device NVM11 of the nonvolatile memory devices NVM11 to NVM1n connected to the first channel CH1. The memory controller 20 may transmit a command CMDa, an address ADDRa, and data DATAa to the selected nonvolatile memory device NVM11 or receive data DATAa from the selected nonvolatile memory device NVM11, through the first channel CH1.

The memory controller 20 may transmit and receive signals to and from the memory 10 in parallel through different channels. For example, the memory controller 20 may transmit a command CMDb to the memory 10 through the second channel CH2 while transmitting the command CMDa to the memory 10 through the first channel CH1. For example, the memory controller 20 may receive data DATAb from the memory 10 through the second channel CH2 while receiving the data DATAa from the memory 10 through the first channel CH1.

The memory controller 20 may control a general operation of the memory 10. The memory controller 20 may control each of the nonvolatile memory devices NVM11 to NVMmn connected to the channels CH1 to CHm by transmitting signals to the channels CH1 to CHm. For example, the memory controller 20 may control one nonvolatile memory device selected among the nonvolatile memory devices NVM11 to NVM1n by transmitting the command CMDa and the address ADDRa to the first channel CH1.

Each of the nonvolatile memory devices NVM11 to NVMmn may operate under the control of the memory controller 20. For example, the nonvolatile memory device NVM11 may program the data DATAa according to the command CMDa, the address ADDRa, and the data DATAa provided to the first channel CH1. For example, the nonvolatile memory device NVM21 may read the data DATAb according to the command CMDb and the address ADDRb provided to the second channel CH2, and transmit the read data DATAb to the memory controller 20.

It has been illustrated in FIG. 1 that the memory 10 communicates with the memory controller 20 through m channels and the memory 10 includes n nonvolatile memory devices corresponding to each channel, but the number of channels and the number of nonvolatile memory devices connected to one channel may be variously modified.

The performance of the memory system 1 may be defined as an amount of data programmed per unit time (MB/s). The amount of data programmed per unit time (MB/s) may refer to a writing speed, and a writing speed of the memory system 1 for a predetermined time may change. A variation width of the writing speed of the memory system 1 for a predetermined time needs to be designed to satisfy a reference value. The reference value may be a value requested by a customer. For example, the variation width of the writing speed of the memory system 1 may be a value corresponding to a difference between a maximum value of the writing speed and an average value of the writing speed, or may be a value corresponding to a difference between a minimum value of the writing speed and the average value of the writing speed. According to an example embodiment, the variation width of the writing speed of the memory system 1 may be a value corresponding to the worst case of the difference between the maximum value of the writing speed and the average value of the writing speed and a difference between the minimum value of the writing speed and the average value of the writing speed, but is not limited thereto.

For example, the variation width of the writing speed of the memory system 1 may refer to a ratio of a difference between the maximum value of the writing speed and the minimum value of the writing speed to the average value of the writing speed, and the reference value may be 10%.

According to an example embodiment, in order for the variation width of the writing speed of the memory system 1 for the predetermined time to satisfy the reference value, the memory controller 20 may confirm a programming time for each word line of each of the nonvolatile memory devices NVM11 to NVMmn, and determine a target programming time on the basis of the programming time for each word line of each of the nonvolatile memory devices NVM11 to NVMmn. Each of the nonvolatile memory devices NVM11 to NVMmn may adjust the programming time for each word line on the basis of the target programming time. Therefore, a consistent quality of service may be provided to the customer by improving the variation width of the writing speed of the memory system 1 for the predetermined time to the value requested by the customer.

In the present example embodiment, a variation width of the performance of the memory system 1 may refer to the variation width of the writing speed of the memory system 1.

Figure 2:
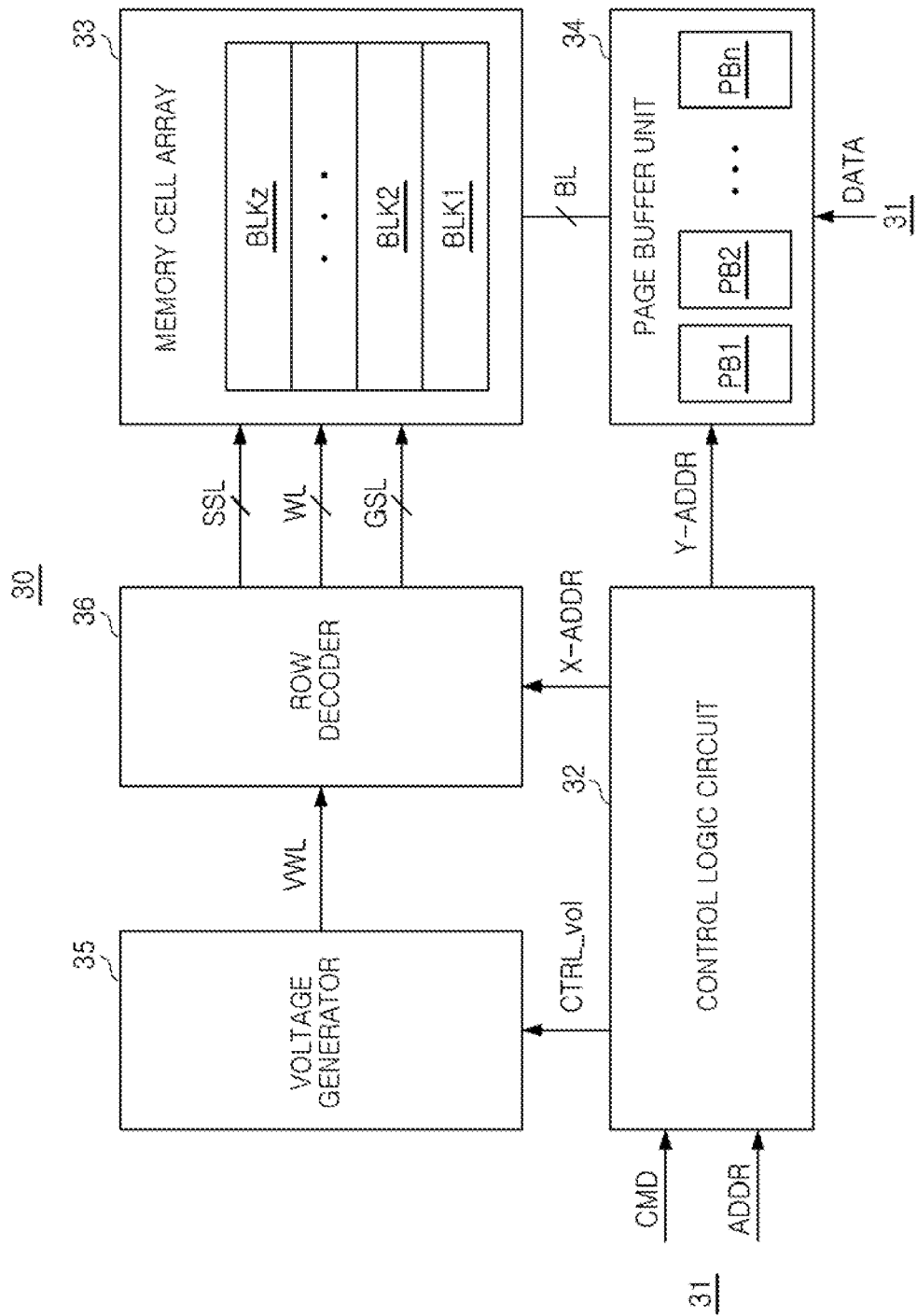
FIG. 2 is a schematic block diagram illustrating a nonvolatile memory device according to an example embodiment.

FIG. 2 is a schematic block diagram illustrating a nonvolatile memory device according to an example embodiment.

Referring to FIG. 2, a nonvolatile memory device 30 may include a control logic circuit 32, a memory cell array 33, a page buffer unit 34, a voltage generator 35, and a row decoder 36. The nonvolatile memory device 30 may further include an interface circuit 31, and may further include a column logic, a pre-decoder, a temperature sensor, a command decoder, an address decoder, a source driver, and the like.

The control logic circuit 32 may generally control various operations within the nonvolatile memory device 30. The control logic circuit 32 may output various control signals in response to a command CMD and/or an address ADDR from the interface circuit 31. For example, the control logic circuit 32 may output a voltage control signal CTRL_vol, a row address X-ADDR, and a column address Y-ADDR.

The memory cell array 33 may include a plurality of memory blocks BLK1 to BLKz (z is a positive integer), and each of the plurality of memory blocks BLK1 to BLKz may include a plurality of memory cells. The memory cell array 33 may be connected to the page buffer unit 34 through bit lines BL, and may be connected to the row decoder 36 through word lines WL, string selection lines SSL, and ground selection lines GSL.

In an example embodiment, the memory cell array 33 may include a three-dimensional (3D) memory cell array, and the 3D memory cell array may include a plurality of NAND strings. Each NAND string may include memory cells each connected to word lines vertically stacked on a substrate. U.S. Pat. Nos. 7,679,133, 8,553,466, 8,654,587, 8,559,235, and U.S. Patent Application Publication No. 2011/0233648 are incorporated herein by reference. In an example embodiment, the memory cell array 33 may include a two-dimensional (2D) memory cell array, and the 2D memory cell array may include a plurality of NAND strings arranged along row and column directions.

The page buffer unit 34 may include a plurality of page buffers PB1 to PBn (n is an integer of 3 or more), and the plurality of page buffers PB1 to PBn may be connected, respectively, to the memory cells through a plurality of bit lines BL. The page buffer unit 34 may select at least one bit line of the bit lines BL in response to the column address Y-ADDR. The page buffer unit 34 may operate as a write driver or a sense amplifier according to an operation mode. For example, at the time of a program operation, the page buffer unit 34 may apply a bit line voltage corresponding to data to be programmed to the selected bit line. At the time of a read operation, the page buffer unit 34 may sense a current or voltage of a selected bit line to sense data stored in the memory cell.

The voltage generator 35 may generate various types of voltages for performing program, read, and erase operations on the basis of the voltage control signal CTRL_vol. For example, the voltage generator 35 may generate a program voltage, a read voltage, a pass voltage, a program verification voltage, an erase voltage, and the like. Some of the voltages generated by the voltage generator 35 may be input to the word lines WL as a word line voltage VWL by the row decoder 36, and the others of the voltages may be input to a common source line by the source driver.

The row decoder 36 may select one of a plurality of word lines WL and may select one of a plurality of string selection lines SSL, in response to the row address X-ADDR. For example, the row decoder 360 may apply the program voltage and the program verification voltage to the selected word line at the time of the program operation, and may apply the read voltage to the selected word line at the time of the read operation.

According to an example embodiment, the nonvolatile memory device 30 may receive a target program time from the memory controller. The control logic circuit 32 may adjust the programming time of the word line on the basis of the target programming time. For example, the control logic circuit 32 may calculate a difference value between the programming time of the word line and the target programming time and delay an end time of the program operation of the word line by the difference value to adjust the programming time of the word line. Therefore, the variation width of the writing speed of the memory system for the predetermined time may be improved to the value requested by the customer.

Figure 3:
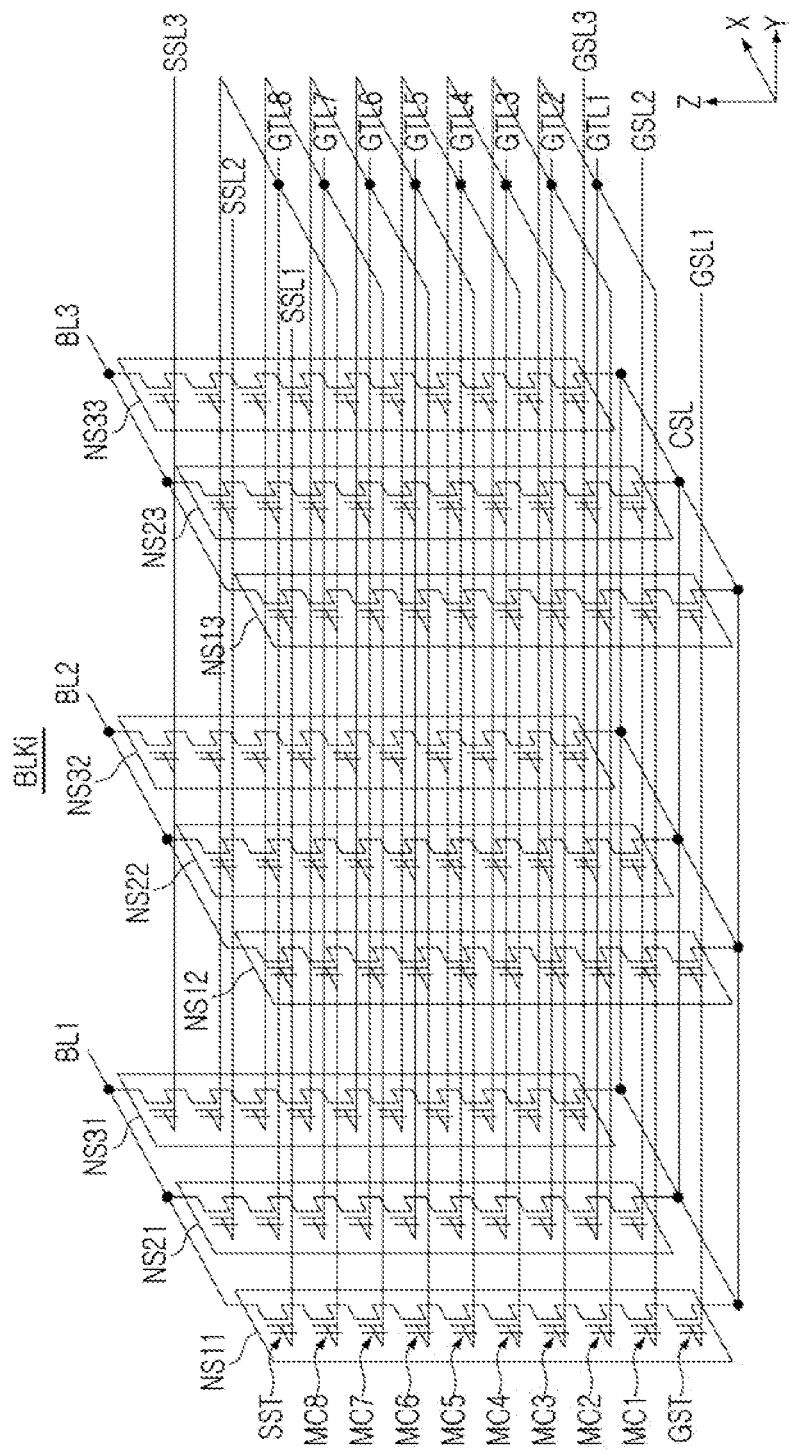
FIG. 3 is a schematic circuit diagram illustrating a memory block of the nonvolatile memory device according to an example embodiment.

FIG. 3 is a schematic circuit diagram illustrating a memory block of the nonvolatile memory device according to an example embodiment.

The memory block BLKi illustrated in FIG. 3 is a three-dimensional memory block formed in a three-dimensional structure on a substrate. For example, a plurality of NAND strings included in the memory block BLKi may be formed in a direction perpendicular to the substrate.

Referring to FIG. 3, the memory block BLKi may include a plurality of NAND strings NS11 to NS33 connected between bit lines BL1, BL2, and BL3 and a common source line CSL. Each of the plurality of NAND strings NS11 to NS33 may include a string selection transistor SST, a plurality of memory cells MC1, MC2, . . . , MC8, and a ground selection transistor GST. It is illustrated in FIG. 3 that each of the plurality of memory NAND strings NS11 to NS33 includes eight memory cells MC1, MC2, . . . , MC8, but each of the plurality of memory NAND strings NS11 to NS33 may be varied.

The string selection transistor SST may be connected to a corresponding string selection line SSL1, SSL2, or SSL3. The plurality of memory cells MC1, MC2, . . . , MC8 may be connected to corresponding gate lines GTL1, GTL2, . . . , GTL8, respectively. The gate lines GTL1, GTL2, . . . , GTL8 may correspond to word lines, and some of the gate lines GTL1, GTL2, . . . , GTL8 may correspond to dummy word lines. The ground selection transistor GST may be connected to a corresponding ground selection line GSL1, GSL2, or GSL3. The string selection transistor SST may be connected to a corresponding bit line BL1, BL2, or BL3. The ground selection transistor GST may be connected to the common source line CSL.

Word lines (for example, WL1) having the same height may be connected in common, and the ground selection lines GSL1, GSL2, and GSL3 and the string selection lines SSL1, SSL2, and SSL3 may be separated from each other, respectively. It is illustrated in FIG. 3 that the memory block BLKi is connected to eight gate lines GTL1, GTL2, . . . , GTL8 and three bit lines BL1, BL2, and BL3, but the memory block BLKi may be varied.

As the number of word lines increases, a time required for programming one memory block may increase. The performance of the memory system may be defined as an amount of data programmed per unit time (MB/s), and the performance of the memory system may be measured in units of 1 second. However, as the time required for programming one memory block increases, the time required for programming one memory block may be longer than the unit time. In this case, the variation width of the performance of the memory system for the predetermined time may become larger.

According to an example embodiment, the memory system may adjust the programming time for each word line of the nonvolatile memory device on the basis of the target programming time. Therefore, the variation width of the performance of the memory system may be improved to the value requested by the customer.

Figure 4:
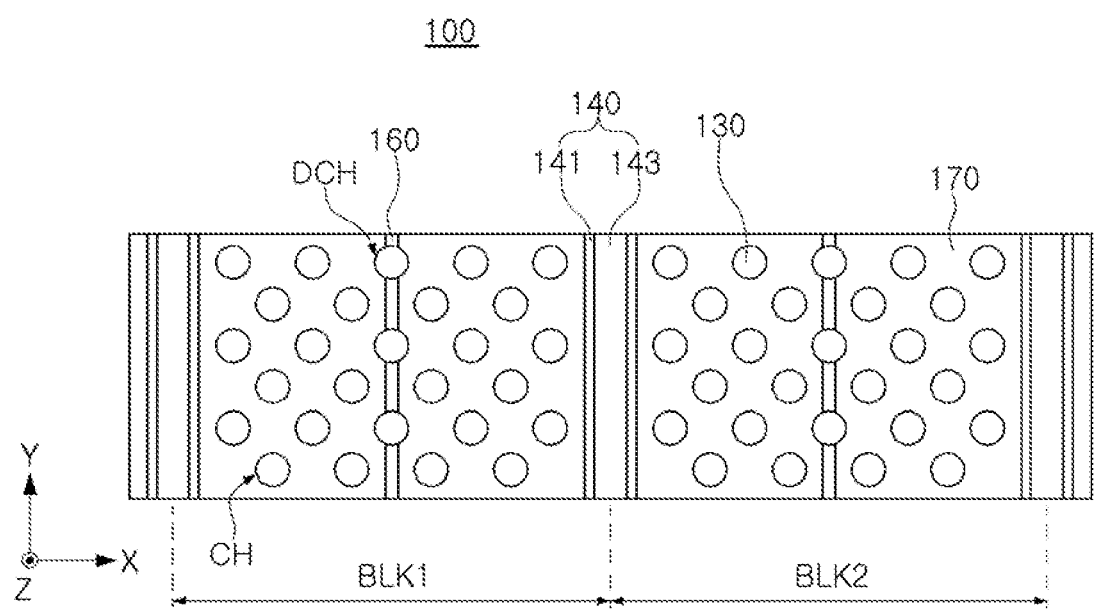
FIGS. 4 and 5 are schematic views illustrating a nonvolatile memory device according to an example embodiment.
Figure 5:
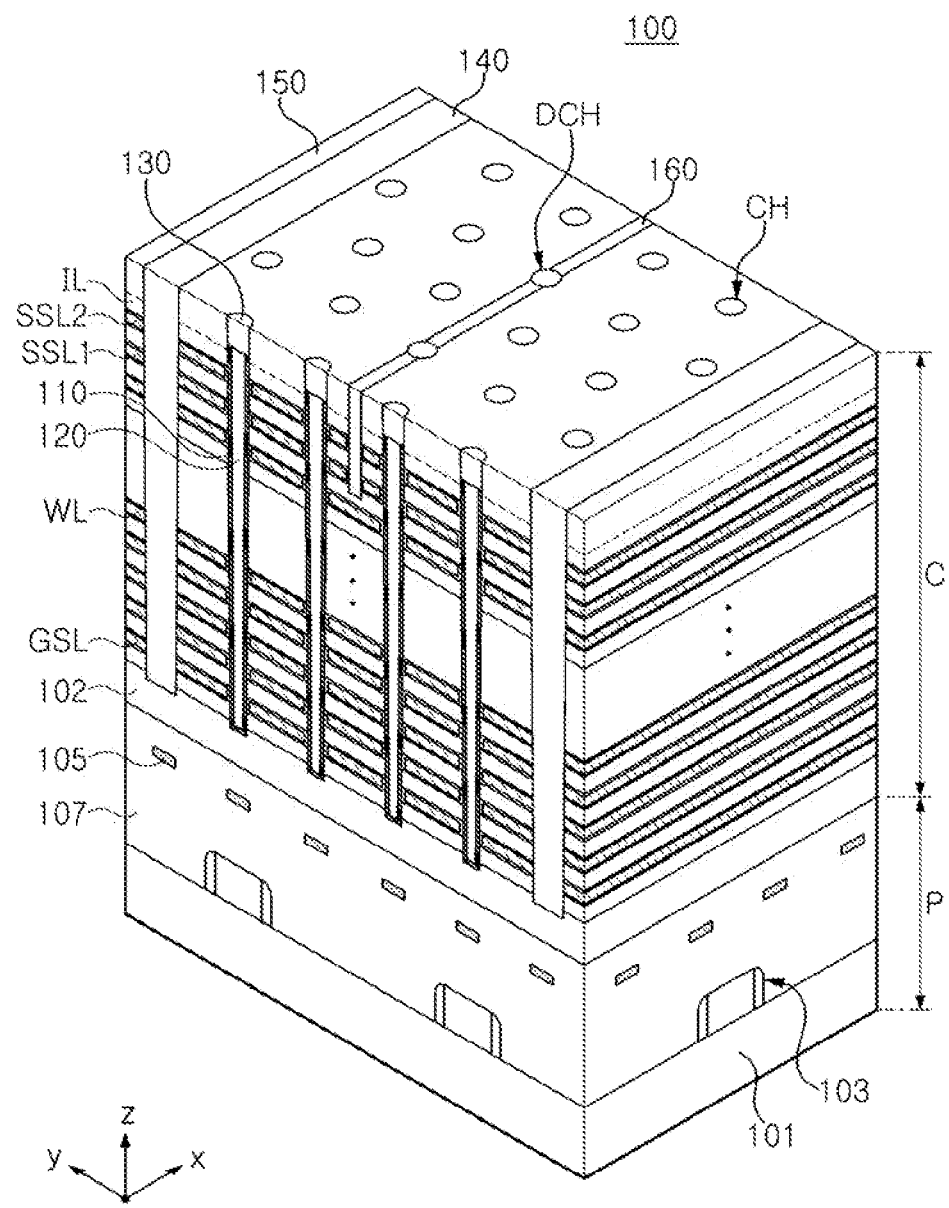

FIGS. 4 and 5 are schematic views illustrating a nonvolatile memory device according to an example embodiment. FIG. 5 is a perspective view illustrating one of the blocks BLK1 and BLK2 in the nonvolatile memory device 100 illustrated in FIG. 4.

Referring to FIG. 4, a nonvolatile memory device 100 according to an example embodiment may include a plurality of blocks BLK1 and BLK2. The plurality of blocks BLK1 and BLK2 may have the same structure, and may be divided by separation layers 140.

Referring to FIGS. 4 and 5, the nonvolatile memory device 100 according to an example embodiment may include a cell region C and a peripheral circuit region P that are disposed above and below each other. The peripheral circuit region P may be disposed below the cell region C. The peripheral circuit region P may include a first substrate 101. The cell region C may include a second substrate 102 different from the first substrate 101.

The peripheral circuit region P may include a plurality of peripheral circuit elements 103 provided on the first substrate 101, a plurality of wiring lines 105 connected to the peripheral circuit elements 103, a first interlayer insulating layer 107 covering the peripheral circuit elements 103 and the wiring lines 105, and the like. The peripheral circuit elements 103 included in the peripheral circuit region P may provide circuits used for driving the nonvolatile memory device 100, such as a page buffer and a row decoder.

The second substrate 102 included in the cell region C may be disposed on the first interlayer insulating layer 107. The cell region C may include a ground selection line GSL, word lines WL, string selection lines SSL1 and SSL2, and a plurality of insulating layers IL stacked on the second substrate 102. The insulating layers IL may be stacked alternately with the ground selection line GSL, the word lines WL, and the string selection lines SSL1 and SSL2. The numbers of ground selection line GSL and string selection lines SSL1 and SSL2 may be variously modified from those illustrated in FIG. 4.

The cell region C may include channel structures CH extending in a first direction (Z-axis direction) perpendicular to an upper surface of the second substrate 102. The channel structures CH may penetrate through the ground selection line GSL, the word lines WL, and the string selection lines SSL1 and SSL2, and be then connected to the second substrate 102. Each of the channel structures CH may include a channel region 110, a buried insulating layer 120 filling an internal space of the channel region 110, a bit line connection layer 130, and the like. Each of the channel structures CH may be connected to at least one bit line through the bit line connection layer 130. The ground selection line GSL, the word lines WL, the string selection lines SSL1 and SSL2, the insulating layers IL, the channel structures CH, and the like, may be defined as a stacked structure.

At least one gate insulating layer may be disposed outside the channel region 110. In an example embodiment, the gate insulating layer may include a tunneling layer, a charge storage layer, a blocking layer, and the like, that are sequentially disposed from the channel region 110. According to an example embodiment, at least one of the tunneling layer, the charge storage layer, and the blocking layer may also be formed to surround the ground selection line GSL, the word lines WL, and the string selection lines SSL1 and SSL2.

The ground selection line GSL, the word lines WL, and the string selection lines SSL1 and SSL2 may be covered with an interlayer insulating layer 150. The ground selection line GSL, the word lines WL, and the string selection lines SSL1 and SSL2 may be separated into a plurality of blocks BLK1 and BLK2 by the separation layers 140. In an example embodiment, between a pair of separation layers 140 adjacent to each other in a second direction (Y-axis direction), the string selection lines SSL1 and SSL2 may be separated into a plurality of regions by an upper separation layer 160.

In an example embodiment, dummy channel structures DCH may be provided in a region where the upper separation layer 160 is disposed. The dummy channel structures DCH may have the same structure as the channel structures CH, but may not be connected to the bit line.

In an example embodiment illustrated in FIG. 5, the channel structures CH and the separation layers 140 may have a shape in which they extend to be elongated in the first direction, and thus, widths of the channel structures CH and the separation layers 140 may change in the first direction. The channel structures CH and the separation layers 140 may have a tapered structure having a width that becomes narrower as they become closer to the second substrate 102.

An operation of programming data into the memory cells or reading data stored in the memory cells may be performed in units of pages. An operation of deleting data written to the memory cells may be performed in units of each of the memory blocks BLK1 and BLK2 divided by the separation layers 140 and 240.

The variation width of the performance of the memory system for a predetermined time needs to satisfy a reference value required by the customer. The performance of the memory system may be defined as an amount of data programmed per unit time (MB/s), and the performance of the memory system may be measured in units of 1 second. However, as the number of stacked stages of the nonvolatile memory device increases, a time required for programming one memory block may be longer than the unit time. There is a difference in time required for programming data for each word line (hereinafter referred to as a 'programming time'), and when the time required for programming one memory block is longer than the unit time, the variation width of the performance of the memory system for the predetermined time may become larger.

According to an example embodiment, the memory system may perform a performance flattening function of adjusting the performance of the memory system by adjusting the programming time for each word line of the nonvolatile memory device.

Figure 6:
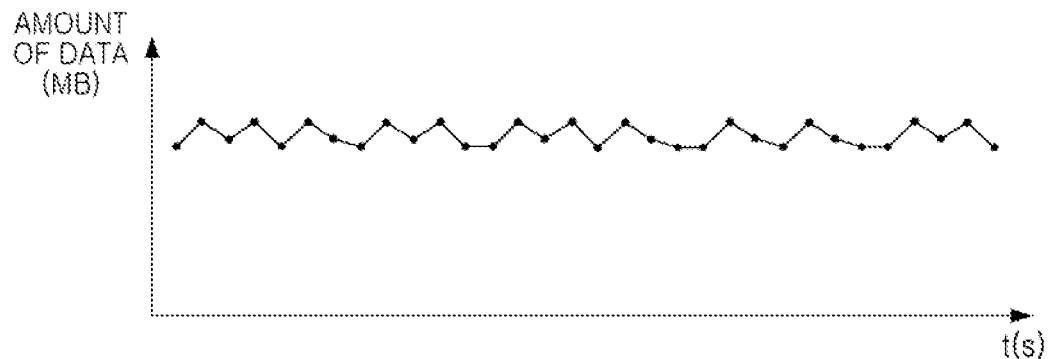
FIG. 6 is a view for describing a variation width of performance of the memory system according to an example embodiment.

FIG. 6 is a view for describing a variation width of performance of the memory system according to an example embodiment.

Referring to FIG. 6, an X-axis represents a time (s), and a Y-axis represents an amount of data (MB). The performance of the memory system may be defined as an amount of data programmed per unit time (MB/s), and the variation width of the performance of the memory system for a predetermined time needs to satisfy the reference value requested by the customer.

Figure 7:
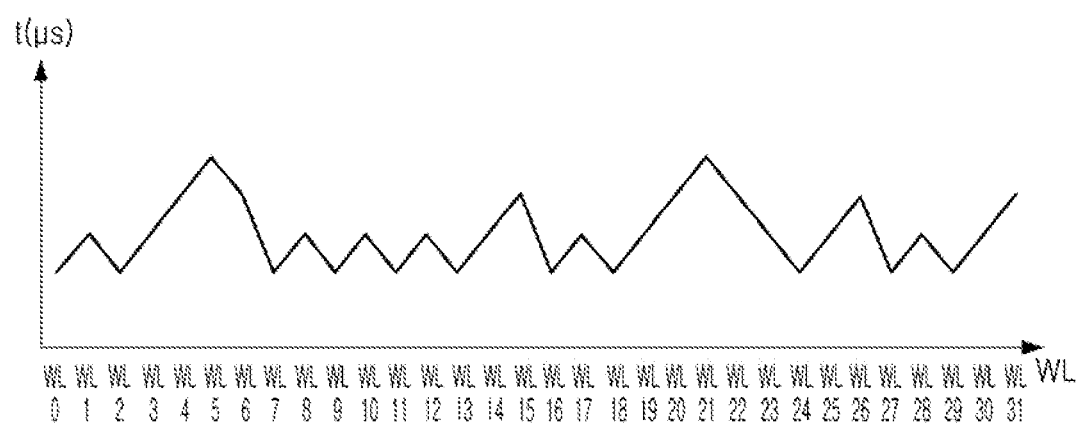
FIG. 7 is a view for describing a difference in programming time for each word line of the nonvolatile memory device according to an example embodiment.

FIG. 7 is a view for describing a difference in programming time for each word line of the nonvolatile memory device according to an example embodiment.

Referring to FIG. 7, an X-axis represents different word lines WL, and a Y-axis represents a programming time (µs). The programming time may be different for each word line. When a difference in programming time for each word line is large, it may affect the variation width of the performance of the memory system.

Figure 8A:
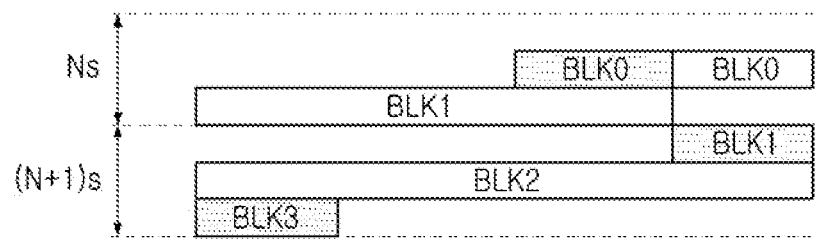
FIGS. 8A and 8B are views for describing the variation width of the performance of the memory system according to an example embodiment.
Figure 8B:
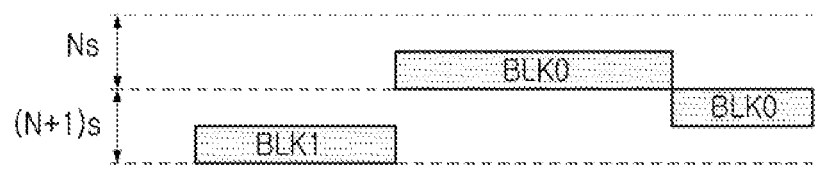

FIGS. 8A and 8B are views for describing the variation width of the performance of the memory system according to an example embodiment.

FIG. 8A illustrates a case where the time required for programming one memory block is shorter than the unit time.

Assuming that the unit time is 1 second, in N-seconds, a part of a 0-th memory block BLK0 may be programmed and a part of a first memory block BLK1 may be programmed. In (N+1)-seconds, the remaining part of the first memory block BLK1 may be programmed, the entirety of a second memory block BLK2 may be programmed, and a part of a third memory block BLK3 may be programmed.

Word line touch sections that do not overlap each other in N-seconds and (N+1)-seconds (that is, a hatched part of the 0-th memory block BLK0, a hatched part of the first memory block BLK1, and a hatched portion of the third memory block BLK3) may be sections that affect the variation width of the performance of the memory system.

FIG. 8B illustrates a case where the time required for programming one memory block is longer than the unit time.

Assuming that the unit time is 1 second, in N-seconds, a part of a 0-th memory block BLK0 may be programmed. In (N+1)-seconds, the remaining part of the 0-th memory block BLK0 may be programmed, and a part of a first memory block BLK1 may be programmed.

Word line touch sections that do not overlap each other in N-seconds and (N+1)-seconds (that is, a hatched part of the 0-th memory block BLK0 and a hatched part of the first memory block BLK1) may be sections that affect the variation width of the performance of the memory system.

Unlike FIG. 8A, in FIG. 8B, as the number of stacked stages of the nonvolatile memory device increases, the time required for programming one memory block becomes longer than the unit time, and the sections that affect the variation width of the performance of the memory system may thus become relatively wider. Even though there is a difference in programming time for each word line in both FIGS. 8A and 8B, the word line sections touched between N-seconds and (N+1)-seconds are all different from each other in FIG. 8B, and thus, the sections that affect the variation width of the performance of the memory system become relatively wider. Therefore, the variation width of the performance of the memory system may become larger.

Figure 9:
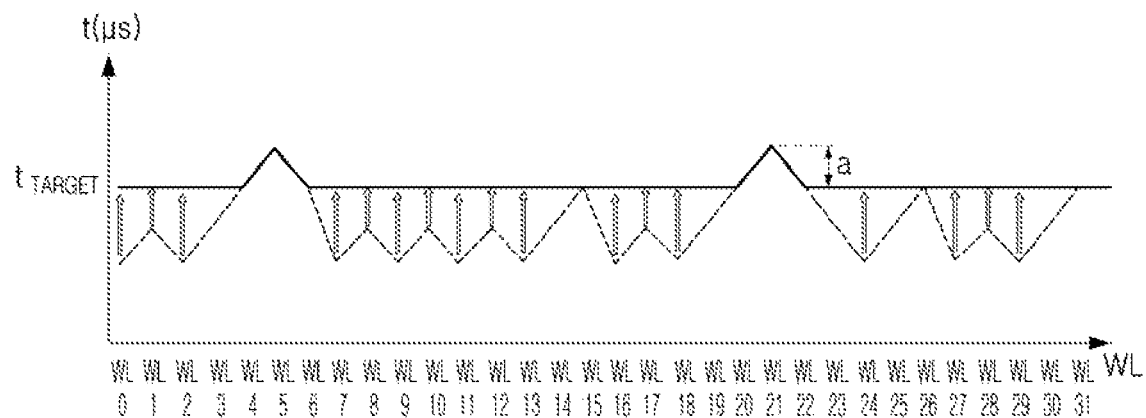
FIG. 9 is a view for describing a difference in programming time for each word line of the nonvolatile memory device according to an example embodiment.

FIG. 9 is a view for describing a difference in programming time for each word line of the nonvolatile memory device according to an example embodiment.

Referring to FIG. 9, the memory system may adjust a programming time for each word line to a target programming time $t_{TARGET}$. For example, when the programming time is longer than the target programming time, the programming time may not be adjusted, and when the programming time is shorter than the target programming time, the programming time may be delayed to the target programming time. Therefore, a difference in programming time between word lines may be reduced by the interval a.

Figure 10:
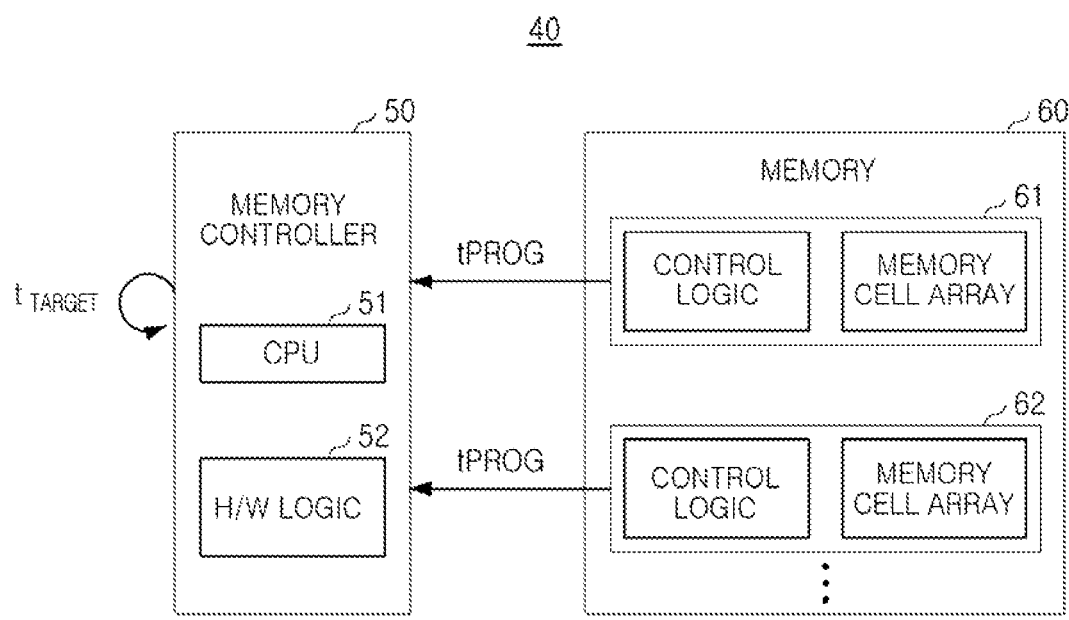
FIGS. 10 and 11 are views for describing a performance flattening work according to an example embodiment.
Figure 11:
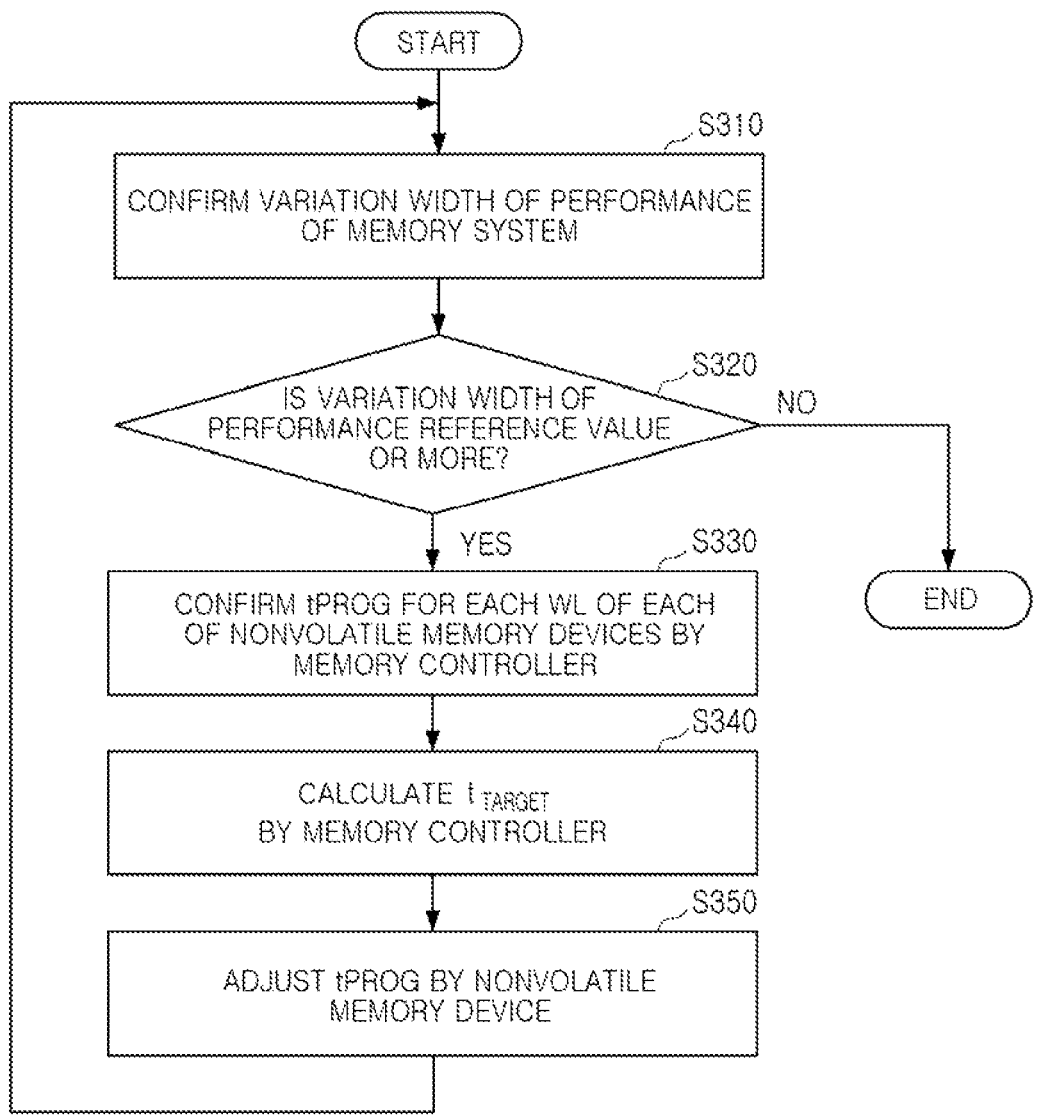

FIGS. 10 and 11 are views for describing a performance flattening work according to an example embodiment.

Referring to FIGS. 10 and 11 together, a memory controller 50 may confirm a variation width of the performance of a memory system 40 for a predetermined time (S310). The performance of the memory system 40 may be defined as an amount of data programmed per unit time (MB/s), and a variation width of a writing speed of the memory system 40 for a predetermined time needs to satisfy a reference value. When the variation width of the performance of the memory system 40 for the predetermined time is the reference value or more (YES in S320), the memory system 40 may perform a performance flattening work in order to adjust the variation width of the performance of the memory system 40 for the predetermined time into the reference value.

The memory controller 50 may confirm a programming time tPROG for each word line of each of nonvolatile memory devices 61 and 62 included in a memory 60 (S330).

The memory controller 50 may calculate a target programming time $t_{TARGET}$ on the basis of the programming time tPROG for each word line (S340). For example, assume that the reference value is 10%. The memory controller 50 may calculate an average value of a maximum value of the programming times for each word line and the target programming time $t_{TARGET}$, and calculate the target programming time $t_{TARGET}$ so that a ratio of a difference between the maximum value and the target programming time $t_{TARGET}$ to the average value satisfies (10%+α). Here, α means an allowable error range.

When the memory controller 50 transmits the target programming time $t_{TARGET}$ to the nonvolatile memory devices 61 and 62, each of the nonvolatile memory devices 61 and 62 may receive the target programming time $t_{TARGET}$. A control logic of each of the nonvolatile memory devices 61 and 62 may adjust the programming time tPROG for each word line on the basis of the target programming time $t_{TARGET}$ (S350).

The control logic may adjust the programming time tPROG for each word line in consideration of data integrity. For example, when the programming time tPROG is longer than the target programming time $t_{TARGET}$, the programming time tPROG may not be adjusted, and when the programming time tPROG is shorter than the target programming time $t_{TARGET}$, the programming time tPROG may be delayed to the target programming time $t_{TARGET}$. Therefore, a difference in programming time between word lines may be reduced.

When the adjustment of the programming time for each word line is completed, the memory controller 50 may confirm a variation width of the performance of the memory system 40 for a predetermined time again (S310). The performance flattening work may be repeated until the variation width of the performance of the memory system 40 satisfies the reference value. When the variation width of the performance of the memory system 40 is equal to or smaller than the reference value (S320), the memory controller 50 may set the target programming time $t_{TARGET}$ as a final target programming time, and end the performance flattening work.

According to an example embodiment, when the number of program/erase (P/E) cycles is a reference number or more, the memory system 40 may perform the performance flattening work again, and the memory controller 50 may set the final target programming time again.

According to an example embodiment, when an external temperature of the memory system 40 is out of a reference temperature range, the memory system 40 may perform the performance flattening work again, and the memory controller 50 may set the final target programming time again.

The performance flattening operation may be implemented as software in a central processing unit (CPU) 51 in the memory controller 50, or may be implemented as a separate hardware logic 52 in the memory controller 50.

Figure 12:
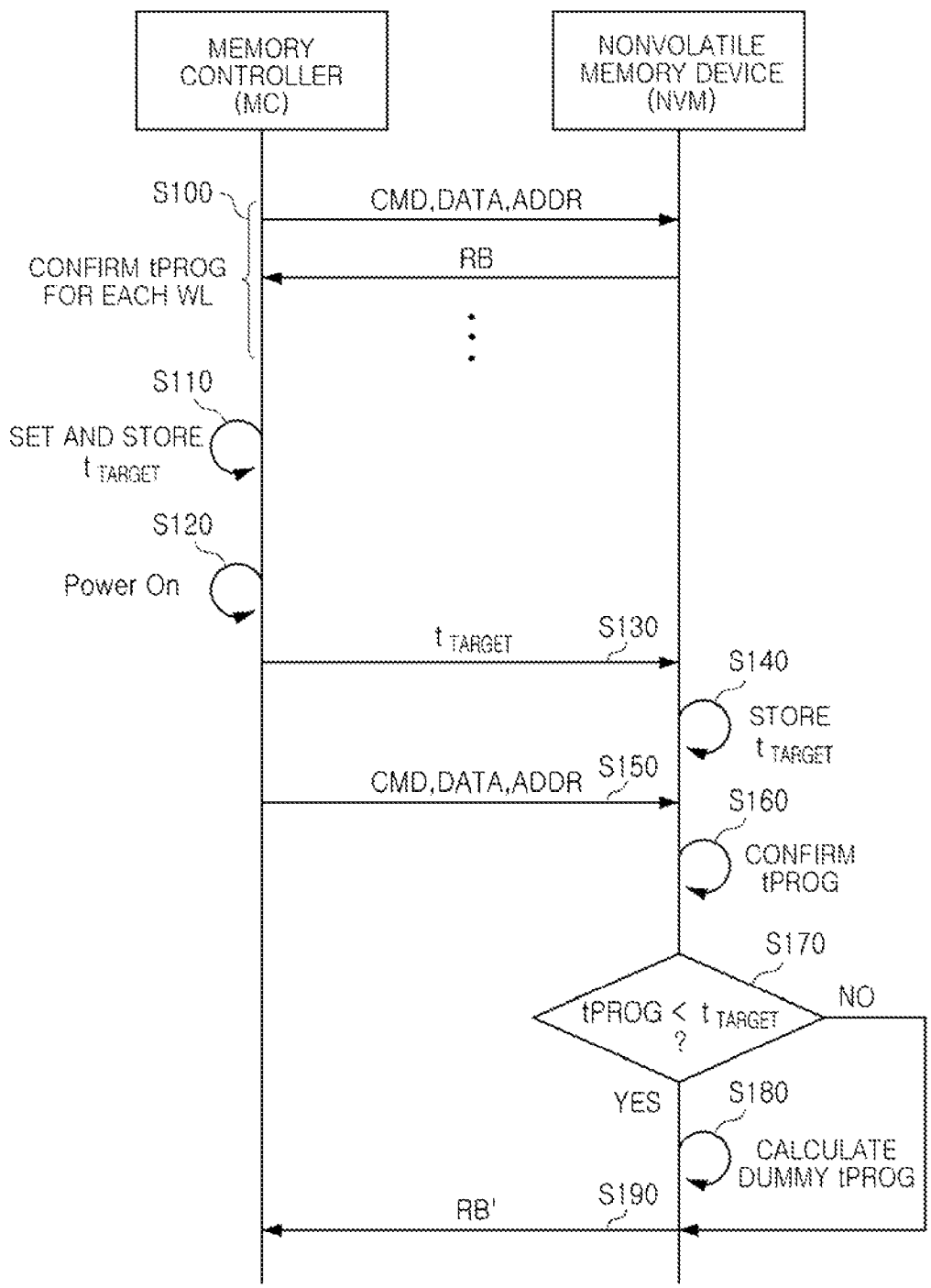
FIG. 12 is a view illustrating commands or data exchanged between a memory controller and a nonvolatile memory device according to an example embodiment.

FIG. 12 is a view illustrating commands or data exchanged between a memory controller and a nonvolatile memory device according to an example embodiment.

Referring to FIG. 12, the memory controller MC may initially confirm a programming time tPROG for each word line of the nonvolatile memory device NVM in order to calculate a target programming time $t_{TARGET}$ (S100). In order to confirm the programming time tPROG for each word line of the nonvolatile memory device NVM, the memory controller MC may transmit a program command CMD, data DATA, and an address ADDR to the nonvolatile memory device NVM, and receive a ready/busy signal RB from the nonvolatile memory device NVM. A method of confirming the programming time tPROG for each word line by the memory controller MC will be described in detail with reference to FIG. 13.

The memory controller MC may set and store the target programming time $t_{TARGET}$ so that a variation width of a writing speed of the memory system satisfies a reference value (S110). A method of setting the target programming time $t_{TARGET}$ by the memory controller MC in FIG. 12 is the same as the method of setting the final target programming time by the memory controller in FIGS. 10 and 11, and a detailed description thereof is thus omitted.

The target programming time $t_{TARGET}$ may be stored in a separate nonvolatile memory inside the memory system or may be stored in the nonvolatile memory device NVM as described below in steps S120 to S140. The target programming time $t_{TARGET}$ will be described in detail with reference to FIG. 14.

When the memory system is powered on (S120), the memory controller MC may transmit the target programming time $t_{TARGET}$ to the nonvolatile memory device NVM (S130). The nonvolatile memory device NVM may store the target programming time $t_{TARGET}$ (S140).

The memory controller MC may transmit a program command CMD, data DATA, and an address ADDR to the nonvolatile memory device NVM in order to program data in the nonvolatile memory device NVM (S150). The nonvolatile memory device NVM may perform a program operation and then confirm the programming time tPROG for each word line (S160).

The nonvolatile memory device NVM may adjust the programming time tPROG for each word line on the basis of the target programming time $t_{TARGET}$. For example, when the programming time tPROG of the word line is shorter than the target programming time $t_{TARGET}$ (YES in S170), the nonvolatile memory device NVM may delay an end time of the program operation. For example, the nonvolatile memory device NVM may calculate a difference value between the target programming time $t_{TARGET}$ and the programming time tPROG of the word line as a dummy programming time (dummy tPROG) (S180).

The nonvolatile memory device NVM may delay the end time of the program operation by the dummy programming time (dummy tPROG). For example, the nonvolatile memory device (NVM) may delay a ready/busy signal RB' indicating that the nonvolatile memory device (NVM) is in a ready state by the dummy programming time (dummy tPROG), and then transmit the ready/busy signal RB' to the memory controller MC (S190).

When the programming time tPROG of the word line is equal to or longer than the target programming time $t_{TARGET}$ (NO in S170), the nonvolatile memory device (NVM) may not adjust the programming time (tPROG) for each word line.

According to an example embodiment, the nonvolatile memory device NVM may adjust the programming time (tPROG) for each word line on the basis of the target programming time $t_{TARGET}$, and the variation width of the writing speed of the memory system 1 may thus be improved to the value required by the customer.

Figures 13, 14:
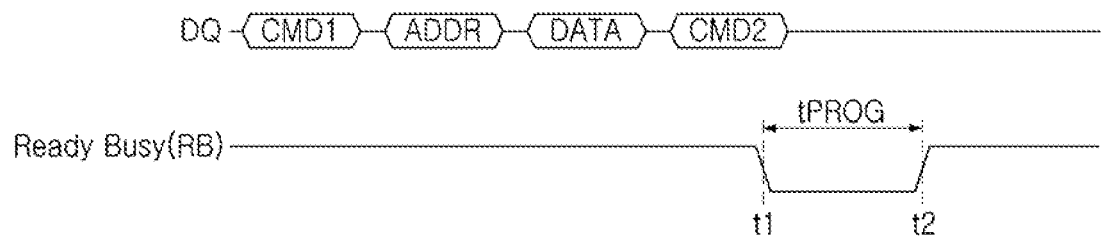
FIG. 13 is a view for describing a method of confirming a programming time of a word line according to an example embodiment.
FIG. 14 is a view illustrating a target programming time according to an example embodiment.

FIG. 13 is a view for describing a method of confirming a programming time of a word line according to an example embodiment.

Referring to FIG. 13, the memory controller may provide commands CMD1 and CMD2, an address ADDR, and data DATA to the nonvolatile memory device through input/output lines. The nonvolatile memory device may provide a ready busy signal RB to the memory controller through a ready busy line. In an example embodiment, the command may include commands for performing a program operation. The command may include a setup command CMD1 and a confirm command CMD2. A command to be performed by the nonvolatile memory device may be determined according to the setup command CMD1. The confirm command CMD2 may be a command instructing the nonvolatile memory device to perform an operation. A program command may be determined by the setup command CMD1, and the nonvolatile memory device may perform a program operation by the confirm command CMD2. The memory controller may provide the address ADDR for the command determined by the setup command to the nonvolatile memory device after outputting the setup command CMD1. The address ADDR refers to a region in which the setup command CMD1 is to be performed. The address ADDR may include a row address and a column address. The nonvolatile memory device may access the region selected by the address ADDR. In an example embodiment, the memory controller may provide the data DATA to the nonvolatile memory device after outputting the address. At the time of a program operation, the nonvolatile memory device will program the data DATA in the region selected by the address. In an example embodiment, the memory controller may output the confirm command CMD2 after outputting the data to the nonvolatile memory device. The confirm command CMD2 may be a command instructing the nonvolatile memory device 100 to perform an operation. The memory controller may provide the confirm command CMD2 to the nonvolatile memory device. The memory controller may determine a point in time t1 at which the confirm command CMD2 is provided from the memory controller to the nonvolatile memory device as a start point in time of the program operation. The ready busy signal RB is provided from the nonvolatile memory device to the memory controller through the ready busy line. The ready busy signal indicates whether the nonvolatile memory device is in a ready state or in a busy state. When the ready busy signal is in a low state, it indicates that the nonvolatile memory device is in the busy state. When the ready busy signal is in a high state, it indicates that the nonvolatile memory device is in the ready state. The memory controller may determine a point in time t2 at which a state of the ready busy signal changes from the busy state to the ready state as an end point in time of the program operation. The nonvolatile memory device may perform the program operation during a programming time tPROG.

The programming time may refer to a time from the start point in time t1 of the program operation to the end point in time t2 of the program operation.

FIG. 14 is a view illustrating a target programming time according to an example embodiment.

A plurality of memory blocks of the nonvolatile memory device may be grouped into a plurality of groups, and memory blocks belonging to the same group may have the same target programming time. Referring to FIG. 14, target programming times of first to hundredth memory blocks BLK1 to BLK100 may be set to a first target programming time $t_{TARGET}1$, target programming times of hundred-first to two hundredth memory blocks BLK101 to BLK200 may be set to a second target programming time $t_{TARGET}2$, and target programming times of two hundred-first to m-th memory blocks BLKk to BLKm may be set to an m-th target programming time $t_{TARGET}m$. k is a natural number greater than or equal to 201 and m is a natural number greater than k.

For example, a target programming time of a first word line of the first memory block may be the first target programming time $t_{TARGET}1$. When a first program operation time of the first word line is shorter than the first target programming time $t_{TARGET}1$, the nonvolatile memory device may set a difference value between the first program operation time and the first target programming time $t_{TARGET}1$ as a dummy programming time. The nonvolatile memory device may delay the ready busy signal by the dummy programming time, and then output the ready busy signal to the memory controller.

For example, a target programming time of a second word line of the hundred-first memory block may be the second target programming time $t_{TARGET}2$. When a second program operation time of the second word line is shorter than the second target programming time $t_{TARGET}2$, the nonvolatile memory device may set a difference value between the second program operation time and the second target programming time $t_{TARGET}2$ as a dummy programming time. The nonvolatile memory device may delay the ready busy signal by the dummy programming time, and then output the ready busy signal to the memory controller.

Figure 15:
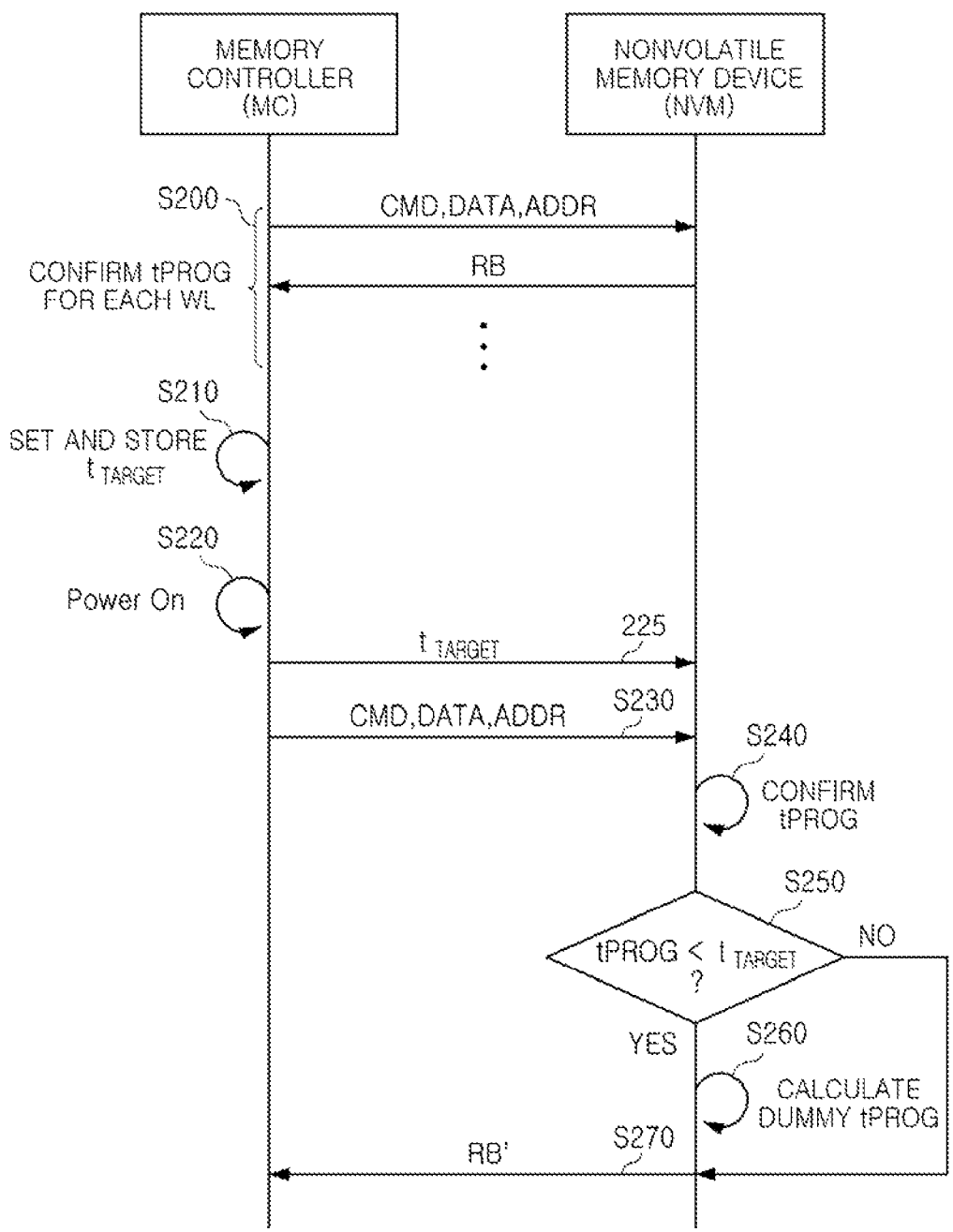
FIG. 15 is a view illustrating commands or data exchanged between a memory controller and a nonvolatile memory device according to an example embodiment.

FIG. 15 is a view illustrating commands or data exchanged between a memory controller and a nonvolatile memory device according to an example embodiment.

Referring to FIG. 15, the memory controller MC may initially confirm a programming time tPROG for each word line of the nonvolatile memory device NVM in order to calculate a target programming time $t_{TARGET}$ (S200). In order to confirm the programming time tPROG for each word line of the nonvolatile memory device NVM, the memory controller MC may transmit a program command CMD, data DATA, and an address ADDR to the nonvolatile memory device NVM, and receive a ready/busy signal RB from the nonvolatile memory device NVM.

The memory controller MC may set and store the target programming time $t_{TARGET}$ so that a variation width of performance of the memory system satisfies a reference value (S210). A method of setting the target programming time $t_{TARGET}$ by the memory controller MC in FIG. 15 is the same as the method of setting the final target programming time by the memory controller in FIGS. 10 and 11, and a detailed description thereof is thus omitted. The target programming time $t_{TARGET}$ may be stored in a separate nonvolatile memory inside the memory system. The target programming time $t_{TARGET}$ will be described in detail with reference to FIG. 16.

The memory system may be powered on (S220), and the memory controller MC may transmit the target programming time $t_{TARGET}$ corresponding to a word line to be programmed to the nonvolatile memory device NVM (S225). The memory controller MC may transmit a program command CMD, data DATA, and an address ADDR to the nonvolatile memory device NVM in order to program data in the word line (S230). According to an example embodiment, the memory controller MC may transmit the target programming time $t_{TARGET}$ together with the program command CMD, the data DATA, and the address ADDR. The nonvolatile memory device NVM may perform a program operation and then confirm the programming time tPROG for each word line (S240).

The nonvolatile memory device NVM may adjust the programming time tPROG for each word line on the basis of the target programming time $t_{TARGET}$. For example, when the programming time tPROG of the word line is shorter than the target programming time $t_{TARGET}$ (YES in S250), the nonvolatile memory device NVM may delay an end time of the program operation. For example, the nonvolatile memory device NVM may calculate a difference value between the target programming time $t_{TARGET}$ and the programming time tPROG of the word line as a dummy programming time (dummy tPROG) (S260).

The nonvolatile memory device NVM may delay the end time of the program operation by the dummy programming time (dummy tPROG). For example, the nonvolatile memory device (NVM) may delay a ready/busy signal RB' indicating that the nonvolatile memory device is in a ready state by the dummy programming time (dummy tPROG), and then transmit the ready/busy signal RB' to the memory controller MC (S270).

When the programming time tPROG of the word line is equal to or longer than the target programming time $t_{TARGET}$ (NO in S250), the nonvolatile memory device (NVM) may not adjust the programming time (tPROG) for each word line.

According to an example embodiment, the nonvolatile memory device NVM may adjust the programming time (tPROG) for each word line on the basis of the target programming time $t_{TARGET}$, and the variation width of the writing speed of the memory system may thus be improved to the value required by the customer.

FIG. 16 is a view illustrating a target programming time according to an example embodiment.

The target programming time may be different for each word line. Referring to FIG. 16, a target programming time of a first word line WL1 may be set to a first target programming time $t_{TARGET}1$, and a target programming time of a second word line WL2 may be set to a second target programming time $t_{TARGET}2$, and a target programming time of an n-th word line WLn may be set to an n-th target programming time $t_{TARGET}n$.

For example, a target programming time appropriate for the first word line of the first memory block may be the first target programming time $t_{TARGET}1$. When a first program operation time of the first word line is shorter than the first target programming time $t_{TARGET}1$, a difference value between the first program operation time and the first target programming time $t_{TARGET}1$ may be set as a dummy programming time. The nonvolatile memory device may delay the ready busy signal by the dummy programming time, and then output the ready busy signal to the memory controller.

For example, a target programming time appropriate for the second word line of the first memory block may be the second target programming time $t_{TARGET}2$. When a second program operation time of the second word line is shorter than the second target programming time $t_{TARGET}2$, a difference value between the second program operation time and the second target programming time $t_{TARGET}2$ may be set as a dummy programming time. The nonvolatile memory device may delay the ready busy signal by the dummy programming time, and then output the ready busy signal to the memory controller.

Figure 17:
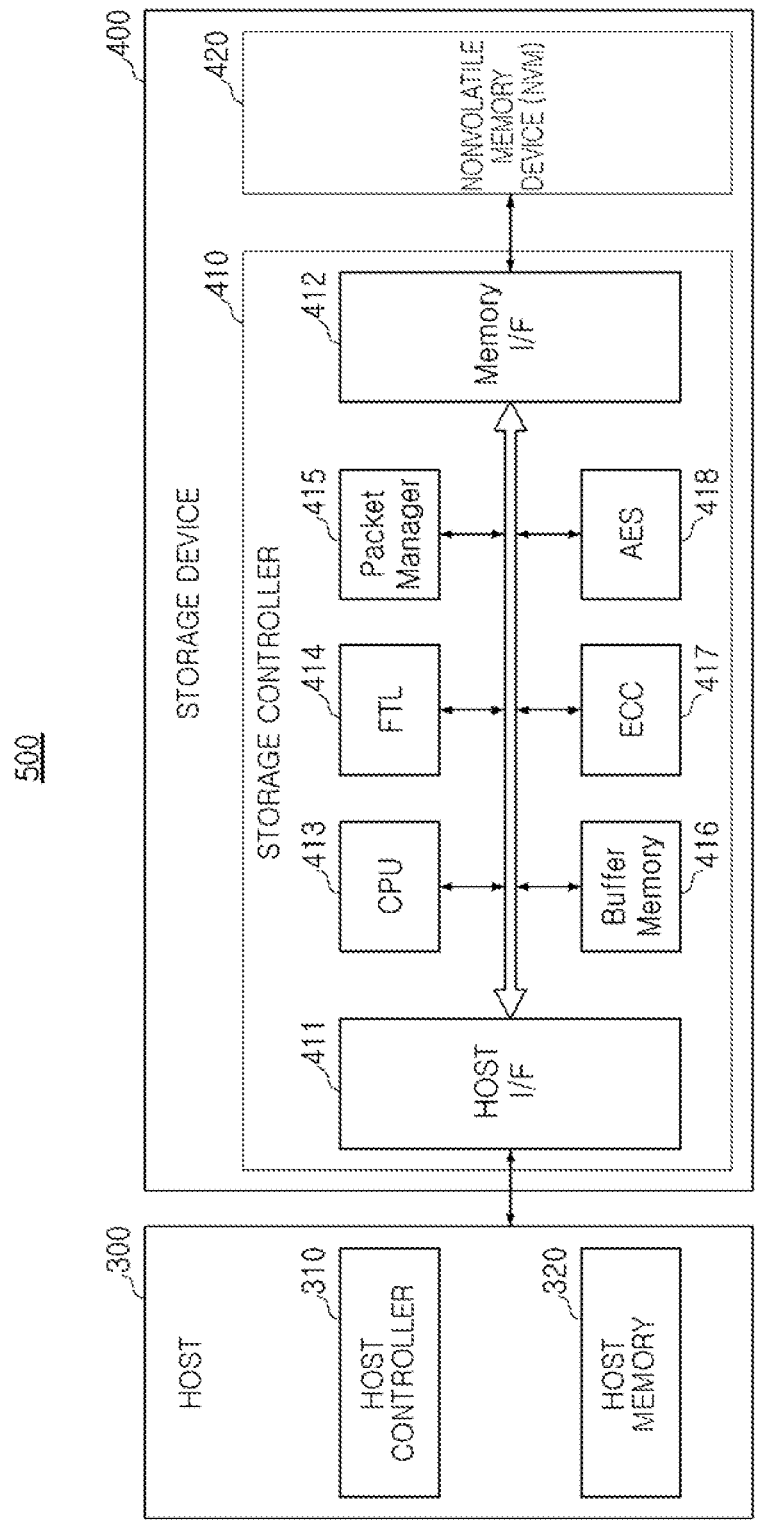
FIG. 17 is a block diagram illustrating a host-storage system according to an example embodiment.

FIG. 17 is a block diagram illustrating a host-storage system according to an example embodiment.

A host-storage system 500 may include a host 300 and a storage device 400. Each of the host 300 and the storage device 400 may generate and transmit a packet according to an adopted standard protocol.

According to an example embodiment, the host 300 may include a host controller 310 and a host memory 320. The host memory 320 may function as a buffer memory for temporarily storing data to be transmitted to the storage device 400 or data transmitted from the storage device 400.

The storage device 400 may include a storage controller 410 and a nonvolatile memory (NVM) 420. The storage device 400 may include storage media for storing data according to a request from the host 300. As an example, the storage device 400 may include at least one of a solid state drive (SSD), an embedded memory, and a removable external memory. When the storage device 400 is the SSD, the storage device 400 may be a device conforming to a nonvolatile memory express (NVMe) standard. When the storage device 400 is the embedded memory or the external memory, the storage device 400 may be a device conforming to a universal flash storage (UFS) or embedded multi-media card (eMMC) standard.

When the nonvolatile memory 420 of the storage device 400 includes a flash memory, the flash memory may include a 2D NAND memory array or a 3D (or vertical) NAND (VNAND) memory array. As another example, the storage device 400 may include various other types of nonvolatile memories. For example, the storage device 400 may include a magnetic random access memory (MRAM), a spin-transfer torque MRAM, s conductive bridging RAM (CBRAM), a ferroelectric RAM (FeRAM), a phase RAM (PRAM), a resistive RAM, and various other types of memories.

According to an example embodiment, the host controller 310 and the host memory 320 may be implemented as separate semiconductor chips. Alternatively, in some example embodiments, the host controller 310 and the host memory 320 may be integrated on the same semiconductor chip. The host controller 310 may be any one of a plurality of modules included in an application processor, and the application processor may be implemented as a system on chip (SoC). In addition, the host memory 320 may be an embedded memory provided in the application processor or be a nonvolatile memory or a memory module disposed outside the application processor.

The host controller 310 may manage an operation of storing data (for example, write data) of the host memory 320 in the nonvolatile memory 420 or stores data (for example, read data) of the nonvolatile memory 420 into the host memory 320.

The storage controller 410 may include a host interface 411, a memory interface 412, and a central processing unit (CPU) 413. The storage controller 410 may further include a flash translation layer (FTL) 414, a packet manager 415, a buffer memory 416, an error correction code (ECC) engine 417, and an advanced encryption standard (AES) engine 418. The storage controller 410 may further include a working memory to which the flash conversion layer (FTL) 414 is loaded, and data write and read operations for the nonvolatile memory may be controlled by the CPU 413 executing the flash conversion layer.

The host interface 411 may transmit and receive packets to and from the host 300. The packet transmitted from the host 300 to the host interface 411 may include a command, data to be written to the nonvolatile memory 420, or the like. The packet transmitted from the host interface 411 to the host 300 may include a response to the command, data read from the nonvolatile memory 420, or the like. The memory interface 412 may transmit data to be written to the nonvolatile memory 420 to the nonvolatile memory 420 or may receive data read from the nonvolatile memory 420. Such a memory interface 412 may be implemented to comply with a standard convention such as toggle or open NAND flash interface (ONFI).

The flash translation layer 414 may perform several functions such as address mapping, wear-leveling, and garbage collection. An address mapping operation is an operation of converting a logical address received from the host into a physical address used to actually store data in the nonvolatile memory 420. The wear-leveling is a technology for preventing excessive deterioration of a specific block by allowing blocks in the nonvolatile memory 420 to be uniformly used, and may be implemented through, e.g., a firmware technology of balancing erase counts of physical blocks. The garbage collection is a technology for securing a usable capacity in the nonvolatile memory 420 in a manner of copying valid data of a block to a new block and then erasing an existing block.

The packet manager 415 may generate a packet according to a protocol of an interface negotiated with the host 300 or may parse various information from a packet received from the host 300.

The buffer memory 416 may temporarily store data to be written to the nonvolatile memory 420 or data to be read from the nonvolatile memory 420. The buffer memory 416 may be provided in the storage controller 410, but may also be disposed outside the storage controller 410.

The ECC engine 417 may perform an error detection and correction function for read data read from the nonvolatile memory 420. For example, the ECC engine 417 may generate parity bits for write data to be written into the nonvolatile memory 420, and the parity bits generated as described above may be stored in the nonvolatile memory 420 together with the write data. At the time of reading data from the nonvolatile memory 420, the ECC engine 417 may correct an error of read data using the parity bits read from the nonvolatile memory 420 together with the read data, and output the read data of which the error is corrected.

The AES engine 418 may perform at least one of an encryption operation and a decryption operation for data input to the storage controller 410 using a symmetric-key algorithm.

According to an example embodiment, the storage controller 410 may set a target programming time so that a variation width of performance of the storage device 400 for a predetermined time satisfies a reference value. According to an example embodiment, the host 300 may also transmit a predetermined target programming time to the storage controller 410. The nonvolatile memory 420 may adjust a programming time for each word line using the target programming time. Therefore, the variation width of the performance of the storage device 400 may be improved to a value requested by the customer.

It has been illustrated and described in the present specification that the programming time for each word line is confirmed and the programming time for each word line is adjusted on the basis of the target programming time, but a programming time for each page may also be confirmed and adjusted.

According to an example embodiment, the memory system may adjust the programming time for each word line to the target programming time, and the variation width of the performance of the memory system for the predetermined time may thus be improved to the value requested by the customer. Therefore, a consistent quality of service (QoS) may be provided to the customer.

By way of summation and review, in accordance with an increase in a degree of integration of memory devices, the number of vertically stacked memory cells has tended to increase, and thus, various methods capable of compensating for a characteristic in which a plurality of memory cells exhibit a characteristic difference therebetween have been considered.

As described above, embodiments may provide a memory system adjusting a programming time for each word line to a target programming time.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory system, comprising:
nonvolatile memory devices respectively including a plurality of memory blocks, each of the plurality of memory blocks including a plurality of memory cells connected to a plurality of word lines; and
a memory controller confirming a programming time for each word line of each of the nonvolatile memory devices and calculating a target programming time on the basis of the programming time for each word line, wherein:
each of the nonvolatile memory devices receives the target programming time from the memory controller, and makes a respective adjustment of the programming time for each word line of the respective nonvolatile memory device on the basis of the target programming time, and
when the adjustment of the programming time for each respective nonvolatile memory device is completed, the memory controller confirms a variation width of a writing speed between the respective adjustments of the nonvolatile memory devices of the memory system for a predetermined time, and sets the target programming time as a final target programming time when the variation width of the writing speed is smaller than a reference value.

2. The memory system as claimed in claim 1, wherein when a number of program/erase (P/E) cycles is a reference number or more, the memory controller sets the final target programming time again.

3. The memory system as claimed in claim 1, wherein when an external temperature is out of a reference temperature range, the memory controller sets the final target programming time again.

4. The memory system as claimed in claim 1, wherein the target programming time is different for each word line of the respective nonvolatile memory device.

5. The memory system as claimed in claim 1, wherein the plurality of memory blocks are grouped into a plurality of groups, and memory blocks belonging to the same group have the same target programming time.

6. The memory system as claimed in claim 1, wherein a point in time at which the memory controller provides a confirm command to the nonvolatile memory device is determined as a start point in time of a program operation, a point in time at which a state of a ready/busy signal indicating that the nonvolatile memory device is in a ready state changes from a busy state to a ready state is determined as an end point in time of the program operation, and the programming time is a time from the start point in time of the program operation to the end point in time of the program operation.

7. The memory system as claimed in claim 1, wherein each of the nonvolatile memory devices delays an end time of a program operation for each word line when the programming time is shorter than the target programming time.

8. The memory system as claimed in claim 7, wherein each of the nonvolatile memory devices calculates a difference value between the programming time and the target programming time for each word line, and delays the end time of the program operation by the difference value.

9. The memory system as claimed in claim 8, wherein each of the nonvolatile memory devices delays a ready/busy signal indicating that the nonvolatile memory device is in a ready state by the difference value, and then transmits the ready/busy signal to the memory controller.

10. The memory system as claimed in claim 1, wherein the variation width of the writing speed is a value corresponding to one of: a difference between a maximum value of the writing speed and an average value of the writing speed, and a difference between a minimum value of the writing speed and the average value of the writing speed.

11. A memory system, comprising:
a nonvolatile memory device including a plurality of word lines; and
a memory controller setting an adjusted target programming time so that a variation width of a writing speed of the memory system for a predetermined time satisfies a reference value, wherein:
the memory controller transmits an initial target programming time corresponding to a word line to be programmed to the nonvolatile memory device, and
when the memory controller transmits a program command for the word line to the nonvolatile memory device, the nonvolatile memory device confirms a programming time of the word line, and adjusts the initial target programming time to form the adjusted target programming time of the word line on the basis of the initial target programming time.

12. The memory system as claimed in claim 11, wherein the adjusted target programming time is different for each word line.

13. The memory system as claimed in claim 11, wherein the nonvolatile memory device delays an end time of a program operation when the adjusted programming time of the word line is shorter than the initial target programming time.

14. The memory system as claimed in claim 11, wherein the nonvolatile memory device calculates a difference value between the programming time of the word line and the initial target programming time for each word line, and delays an end time of a program operation by the difference value.

15. The memory system as claimed in claim 14, wherein the nonvolatile memory device delays a ready/busy signal indicating that the nonvolatile memory device is in a ready state by the difference value, and then transmits the ready/busy signal to the memory controller.

16. A memory system, comprising:
a nonvolatile memory device including a plurality of memory blocks; and
a memory controller setting a target programming time so that a variation width of a writing speed of the memory system for a predetermined time satisfies a reference value, wherein:
at a power-on time of the memory system, when the memory controller transmits the target programming time to the nonvolatile memory device, the nonvolatile memory device stores the target programming time, and
when the memory controller transmits a program command for a word line to the nonvolatile memory device, the nonvolatile memory device confirms a programming time of the word line, and adjusts the programming time of the word line on the basis of the target programming time.

17. The memory system as claimed in claim 16, wherein the plurality of memory blocks are grouped into a plurality of groups, and memory blocks belonging to the same group have the same target programming time.

18. The memory system as claimed in claim 16, wherein the nonvolatile memory device delays an end time of a program operation when the programming time of the word line is shorter than the target programming time.

19. The memory system as claimed in claim 16, wherein the nonvolatile memory device calculates a difference value between the programming time of the word line and the target programming time for each word line, and delays an end time of a program operation by the difference value.

20. The memory system as claimed in claim 19, wherein the nonvolatile memory device delays a ready/busy signal indicating that the nonvolatile memory device is in a ready state by the difference value, and then transmits the ready/busy signal to the memory controller.

* * * * *